United States Patent [19]
Minich et al.

[11] Patent Number: 5,580,280
[45] Date of Patent: Dec. 3, 1996

[54] FILTERED ELECTRICAL CONNECTOR

[75] Inventors: Steven E. Minich, Carlisle; James M. English, Bainbridge, both of Pa.

[73] Assignee: The Whitaker Corporation, Wilmington, Del.

[21] Appl. No.: 497,010

[22] Filed: Jun. 30, 1995

[51] Int. Cl.⁶ .................................................. H01R 13/66
[52] U.S. Cl. .......................................... 439/620; 333/182
[58] Field of Search ..................... 439/620; 333/181–185

[56] References Cited

U.S. PATENT DOCUMENTS

| | | | |
|---|---|---|---|
| 4,376,922 | 3/1983 | Muzslay | 333/182 |
| 4,500,159 | 2/1985 | Briones et al. | 339/147 R |
| 4,582,385 | 4/1986 | Couper et al. | 339/147 R |
| 4,660,907 | 4/1987 | Belter | 339/14 R |
| 4,695,115 | 9/1987 | Talend | 439/76 |
| 4,707,048 | 11/1987 | Gliha et al. | 439/620 |
| 4,726,790 | 2/1988 | Hadjis | 439/620 |
| 4,934,960 | 6/1990 | Capp et al. | 439/620 |
| 5,087,212 | 2/1992 | Hanami | 439/620 |
| 5,094,628 | 3/1992 | Kano | 439/620 |
| 5,102,354 | 4/1992 | Crane et al. | 439/620 |
| 5,112,253 | 5/1992 | Swift | 439/620 |
| 5,141,455 | 8/1992 | Ponn | 439/620 |
| 5,151,054 | 9/1992 | Briones et al. | 439/620 |
| 5,152,699 | 10/1992 | Pfeifer | 439/620 |
| 5,213,522 | 5/1993 | Kojima | 439/620 |
| 5,246,389 | 9/1993 | Briones | 439/620 |
| 5,340,334 | 8/1994 | Nguyen | 439/620 |
| 5,399,099 | 3/1995 | English et al. | 439/417 |

*Primary Examiner*—Gary F. Paumen

[57] ABSTRACT

The electrical connector comprises a housing having contact receiving passages with contacts disposed therein. Recesses are disposed along a mounting face of the connector and are defined by walls therealong. The recesses are in communication with the contact receiving passages. A rigid ground bar is disposed along sidewalls of the housing. Chip capacitors are positioned in the recesses to have one electrode electrically connected with the contact and the other electrode to be electrically connected with the ground bar. The chip capacitor provides a low impedance pathway for EMI from the contact to the ground.

13 Claims, 4 Drawing Sheets

FILTERED ELECTRICAL CONNECTOR

FIELD OF THE INVENTION

This invention relates to electrical connectors, and more particularly to filtered electrical connectors, for providing protection against electromagnetic interference.

BACKGROUND OF THE INVENTION

Electrical circuitry often must be protected from disruptions caused by electromagnetic interference (EMI) entering the system.

Frequently today's electronic circuitry requires the use of high density, multiple contact electrical connectors. There are many applications in which it is desirable to provide a connector with a filtering capability, for example, to suppress EMI. To retain the convenience and flexibility of the connector, however, it is desirable that the filtering capability be incorporated into connectors in a manner that will permit full interchangeability between the filtered connectors and their unfiltered counterparts. In particular, any filtered connectors should also in many instances retain substantially the same dimensions as the unfiltered version and should have the same contact arrangement so that either can be connected to an appropriate mating connector.

U.S. Pat. No. 5,340,334 discloses an electrical connector wherein a chip capacitor is secured between a contact pin and a ground plane. Electrical connection between the electrodes of the capacitor and both the signal and the ground is maintained by using a resilient conductive means, such as an elastomeric connector. U.S. Pat. No. 4,660,907 discloses a filtered electrical connector wherein the chip capacitors are maintained between the signal contact pin and the flanges of the ground plane.

It would be an advantage to have chip capacitors maintained between signal contacts and a ground bar on the connector. It would also be an advantage to have chip capacitors maintained within the connector without using soldering.

SUMMARY OF THE INVENTION

The electrical connector of the current invention comprises a housing having sidewalls, mounting flanges, and a mounting face. Contact receiving passages are disposed within the connector. A recess is disposed along the mounting face and is defined by walls along the mounting face. The recess is in communication with the contact receiving cavity. A contact is secured within the contact receiving cavity. A rigid ground bar extends lengthwise along the housing and is in communication with the recess. A chip capacitor is disposed within the recess. One electrode of the capacitor is in electrical contact with the contact. The other electrode is in electrical contact with the ground bar. The capacitor being secured within the recess between the rigid contact and the rigid ground bar.

BRIEF DESCRIPTION OF DRAWINGS

Embodiments of the inventions will be described by way of example with reference to the accompanying drawings, in which.

DETAILED DESCRIPTION OF THE INVENTION

Figure 1:
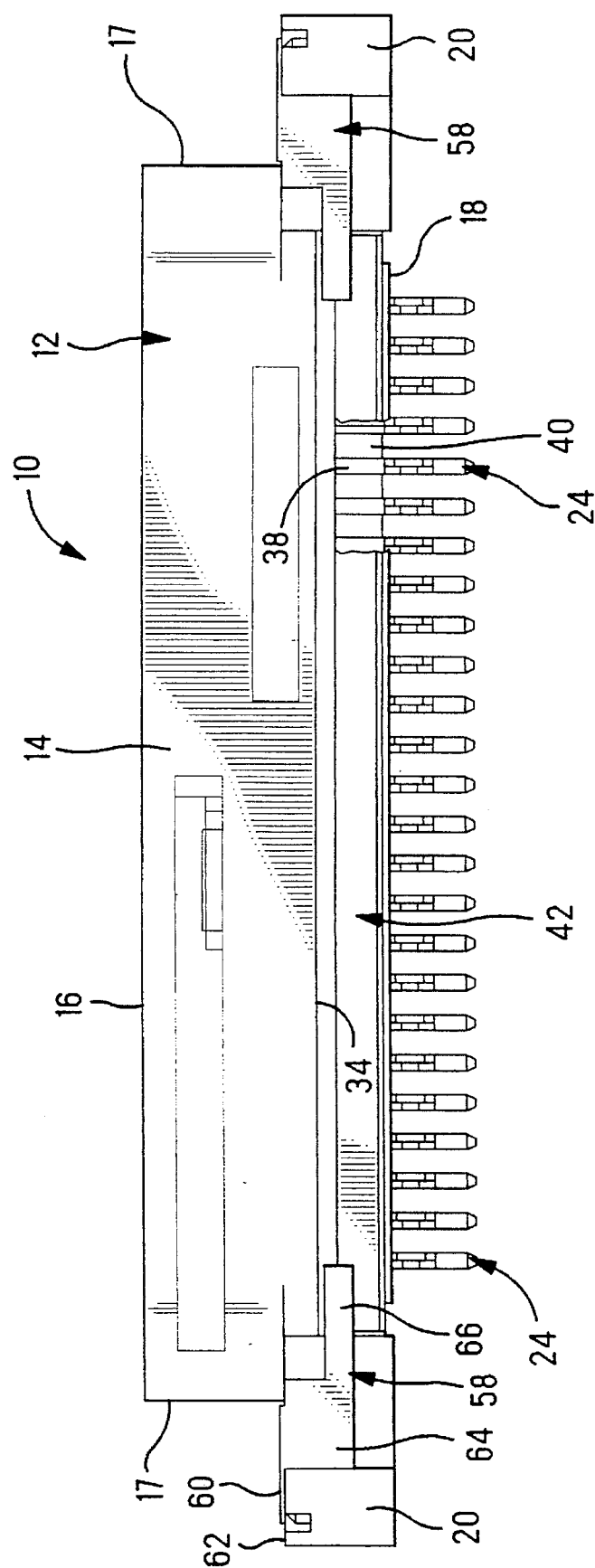
FIG. 1 is a side view of the connector of the current invention.

FIG. 1 shows the filtered electrical connector 10 of the present invention. The connector 10 is a typical connector designed to be mounted on a printed circuit board and to mate with a matable connector. The connector 10 has a dielectric housing 12 with side walls 14, a mating face 16, a mounting face 18, two ends 17, and two mounting flanges 20 which extend off both ends 17 of the housing 12. The housing 12 has an interior mating cavity 22 and contact receiving passages 32 which extend from the interior cavity 22 to the mounting face 18, see FIG. 2. The connector is to be mounted onto a circuit board 11 with the mounting face 18 adjacent to the circuit board.

Figure 2:
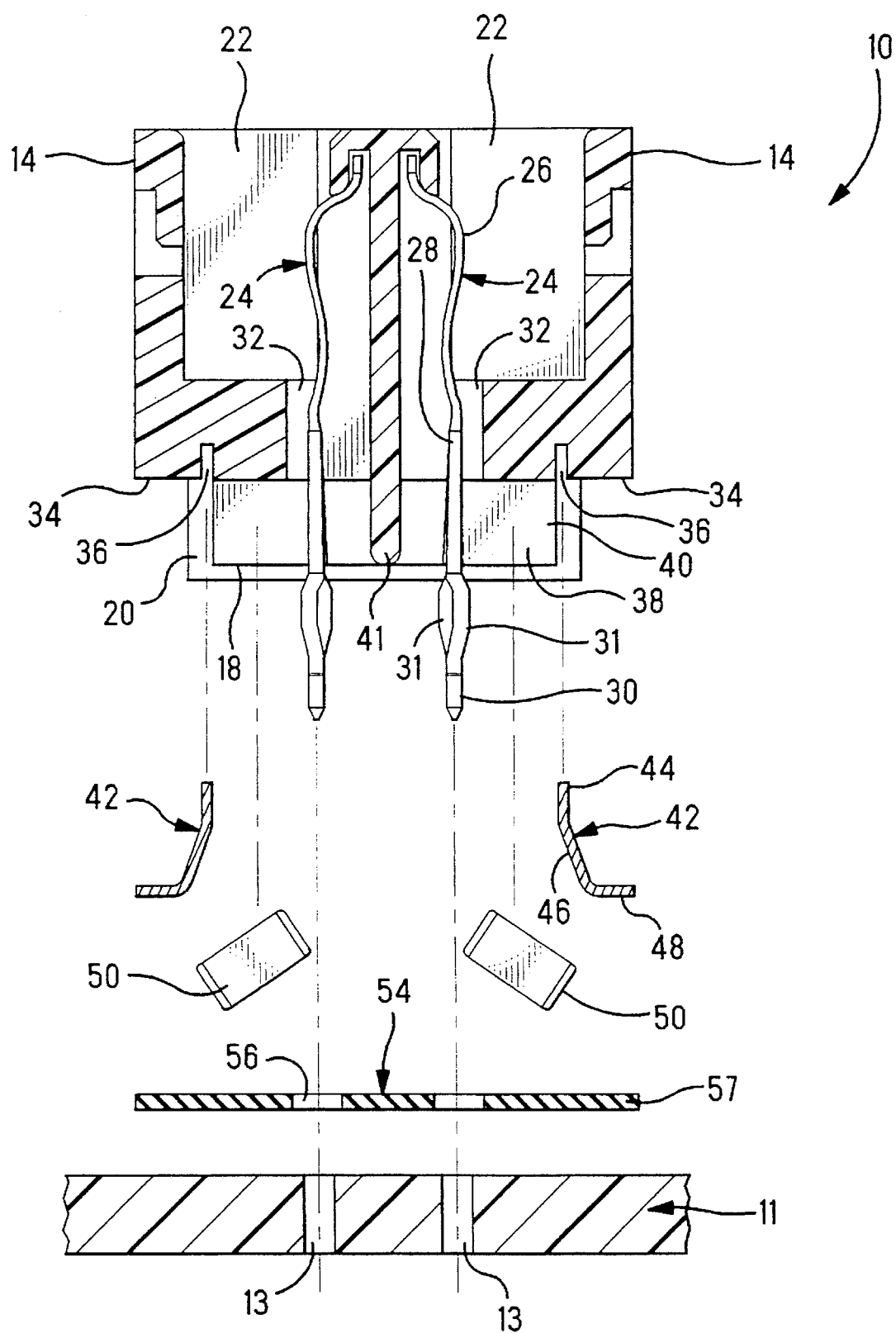
FIG. 2 is an exploded cross sectional view.

Contacts 24 are disposed in the housing 12 in two rows and each have a mating portion 26 which is disposed in the interior mating cavity 22, an intermediate portion 28 which is secured in the contact receiving passage 32, and a mounting portion 30 which extends beyond the mounting face 18, see FIG. 2. The mating portion 26 is a curved resilient portion to give good electrical connection with a contact in a matable connector, not shown. The mounting portion 30 of the contact has resilient legs 31 which are used to secure the contact and the connector in a through hole 13 in the circuit board 11. The resilient legs 31 are deflected upon insertion and serve both to provide a mechanical and an electrical connection to the circuit board 11.

The contacts are shown having a though hole mounting section, and receptacle type mating sections, however, the contact could be of any type such as a surface mount type, pin type contact, or a box receptacle type contact just for example. It is to be understood that the invention is suitable for use with a variety of connectors and electrical terminals having other contact sections, mounting sections, and methods of mounting the contact within the passages. Furthermore, the present invention could be used in a connector having any number and configuration of contacts mounted therein.

The sidewalls 14 of the connector 10 each have an overhang 34 towards the bottom of the housing, see FIG. 2. The overhang 34 is directed toward the mounting face 18. A slot 36 is disposed along each of the overhangs 34 from one mounting flange 20 to the other. Below the overhang 34, and along the mounting face 18 are recesses 38. The recesses 38 are defined by walls 40 which extend downwardly from the overhang 34. The walls 40 are positioned interiorly from the slot 36. Wall 41 extends down the middle of the housing separating recess 38 and contacts 24 on one side of the housing from recess 38 and contacts 24 on the other side of the housing 12. Each recess 38 is in communication with one contact receiving cavity 32, and is open towards the sides of the housing 12 and along the mounting face 18. The intermediate portion 28 of the contact 24 is disposed along one end of the recess 38. FIG. 1 shows a partial sectional showing the recesses 38 along the mounting face 18 of the connector. Each recess has a contact 24 disposed at one end of the recess 38.

A rigid, conductive, ground bar 42 is disposed in each of the slots 36 and extends lengthwise from one mounting flange 20 to the other, thereby closing the recesses along the sides of the housing. The recess 38 are therefore only open to the mounting face 18 of the connector 10. The ground bar 42 has a securing portion 44 which is received in the slot 36, a mounting portion 46 which is perpendicular to the securing portion and is disposed along the mounting face 18, and an angled portion 48 which extends from the securing portion 44 to the mounting portion 46.

Chip capacitors 50, having two separated electrodes, are placed in the recesses 38 and are secured between the contacts 24 and the ground bar 42 to suppress EMI. One of the electrodes is in electrical contact with intermediate portion 28 of the contact 24, and the other electrode is in electrical contact with the ground bar 42. The capacitor 50 is secured between the rigid contact 24 and the rigid ground bar 42. The capacitor 50 is disposed at an angle within the recess 38 to provide a concentrated point of electrical contact between the capacitor 50 and the contact 24 also between the capacitor 50 and the ground bar 42.

Figure 3:
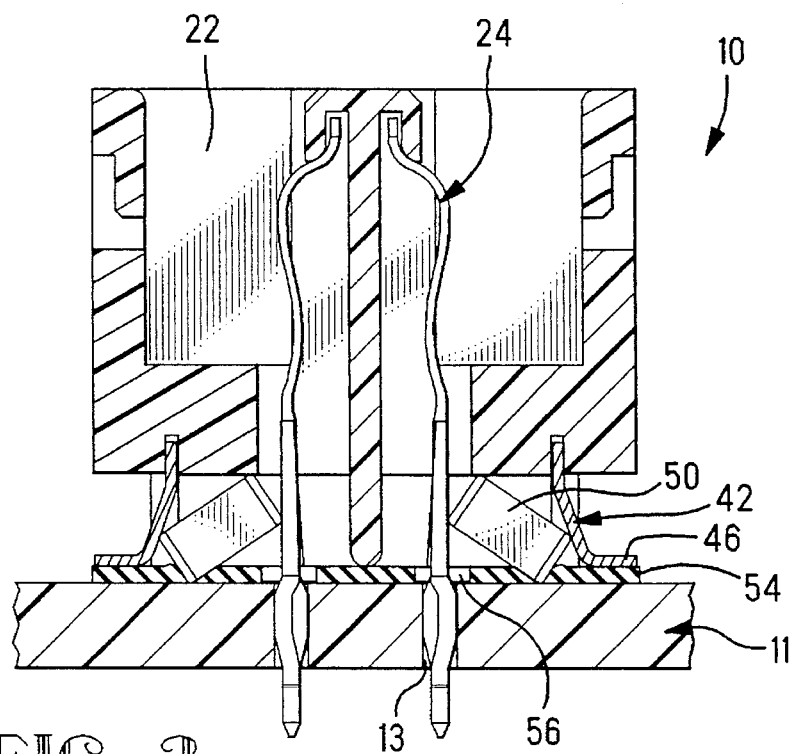
FIG. 3 is a cross sectional view of the connector mounted to a printed circuit board similar to FIG. 2.
Figure 4:
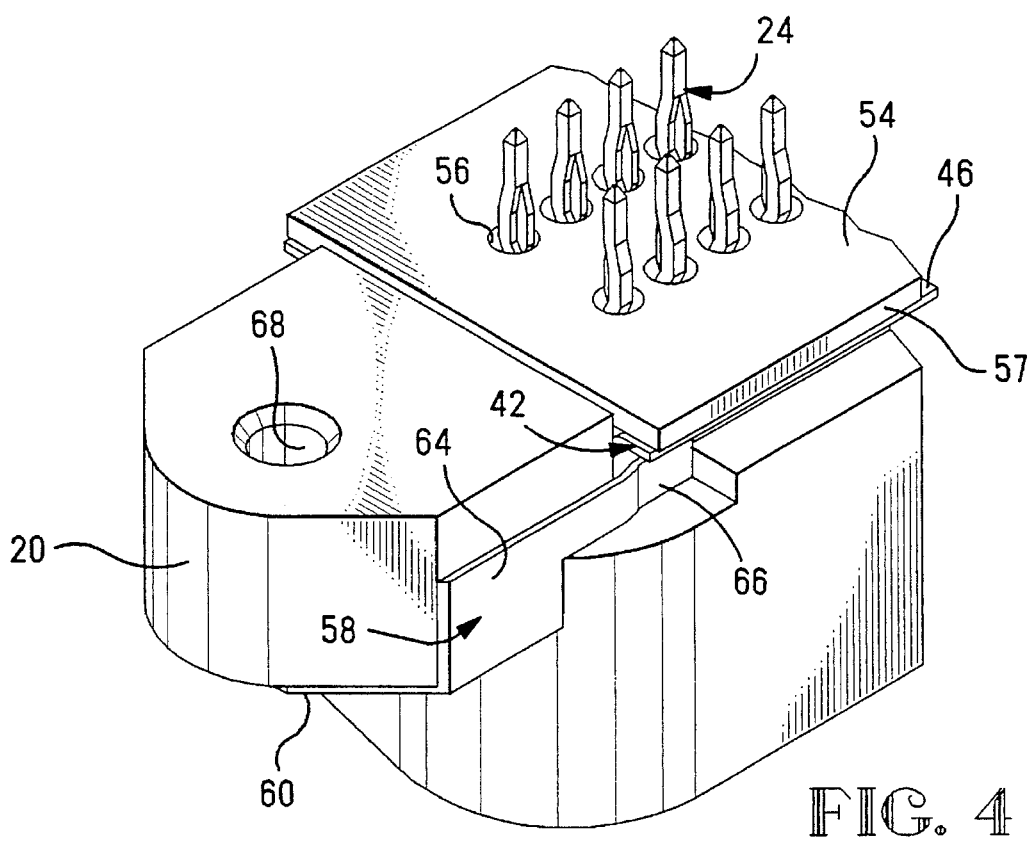
FIG. 4 is an isometric view showing the bottom of the connector.

A silicon rubber pad 54, or some other elastomeric pad, is secured over the mounting face 18, see FIG. 4, to provide a resilient force against the capacitors 50 upon insertion into the circuit board, to keep them within the recesses 38 and in electrical contact with the contact 24 and the ground bar 42. The silicon rubber pad 54 is rectangular in shape, has holes 56 through which contacts 24 extend. The silicon rubber pad 54 is secured along the mounting face 18 by an adhesive between edges 57 of the silicon rubber pad 54 and the mounting portion 46 of the ground bar 42. When the connector 10 is mounted to a printed circuit board 11, the silicon rubber pad 54 is compressed and provides a force against the angled chip capacitor which provides a force against the ground plate, see FIG. 3. The ground plate in turn directs the force back towards the contact to provide a good electrical connection between the chip capacitor and both the ground plate and the contact. The silicon rubber pad 54 retains the chip capacitors 50 in the proper position in the cavity during shipping and prior to mounting on the circuit board.

Figure 5:
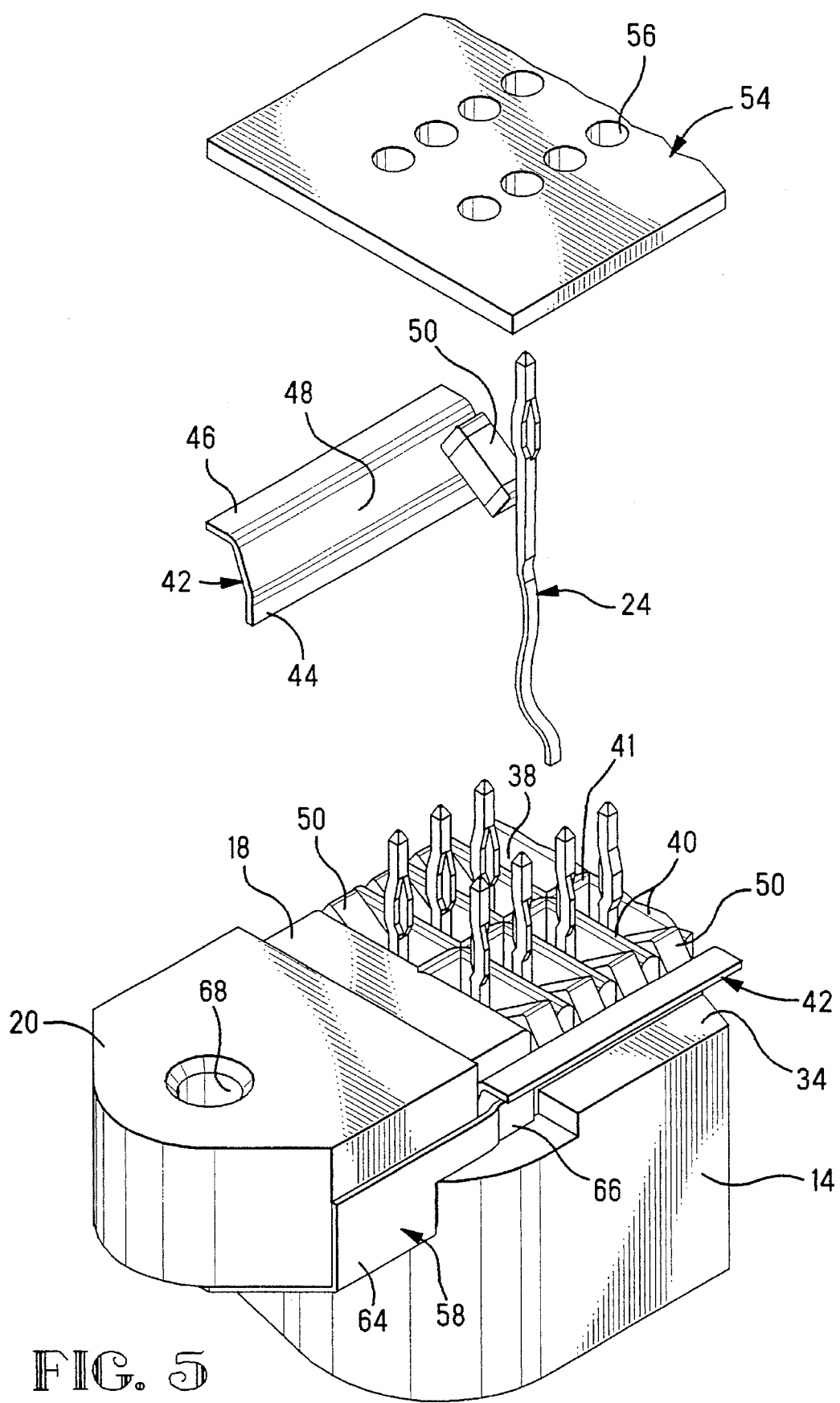
FIG. 5 is an exploded view of the contact, chip capacitor, and ground bar.

FIG. 4 shows a bottom view of the connector 10 having the silicon rubber pad 54 mounted to the ground bar 42. FIG. 5 shows an exploded view of the bottom of the connector showing the capacitors 50 mounted in the recesses 38. The capacitors 50 are in contact with the contacts and also with the ground bar 42.

The mounting flanges 20 each have an end cap 58 secured thereon, see FIG. 1. The end cap 58 has a top portion 60 which extends over the top 62 of the mounting flange 20. Side portions 64 extend along both sides of the mounting flange. The side portions 64 have extensions 66 which extend beyond the mounting flange 24 and along ends of the ground bar 42. The extensions 66 are soldered to the ground bar 42 to provide electrical connection thereto. The mounting flange 20 has a screw hole 68 extending from the top of the flange through to the mounting face 18. The end cap 58 also has a screw hole, not shown, along the top portion 60 which is aligned with the screw hole 68 on the mounting flange. A conductive screw, not shown, is received through both screw holes and is used to secure the connector 10 to the printed circuit board 11 and also to provide a ground connection between the printed circuit board, the end cap 58 and the ground bar 42.

The electrical connector thus provides a low impedance pathway for EMI between the contact and the ground bar via the chip capacitor. The ground bar is electrically connected to the circuit board by way of and end cap and a conductive screw.

It is an advantage to have the capacitors retained within the connector without the use of soldering. The solderless design will allow the contacts to adjust for their true position when mounted on the circuit board, while not sacrificing the integrity of the connector by breaking electrical contact with the chip capacitor. If the chip capacitors were soldered to the ground bar or the contacts, the soldering could crack thereby breaking the electrical connection. The elastomeric pad further provides a force which causes electrical contact between the angled chip capacitor, the ground bar, and the contact upon mounting on the circuit board. This design retains reliability while keeping manufacturing costs down. Furthermore, it is an advantage to have an elastomeric pad which retains the chip capacitors during shipping and prior to mounting on the circuit board.

The electrical connector of the present invention and many of its attendant advantages will be understood from the foregoing description. It is apparent that various changes may be made in the form, construction, and arrangement of parts thereof without departing from the spirit or scope of the invention, or sacrificing all of its material advantages.

We claim:

1. An electrical connector, comprising:

a housing having sidewalls, mounting flanges, a mounting face, an interior mating cavity, a contact receiving passageway, and a recess disposed along the mounting face, the recess being defined by walls along the mounting face, the recess being open to the mounting face and towards sides of the housing, the recess also being in communication with the contact receiving passageway;

a contact being secured within the contact receiving passageway, the contact having a mating portion, a rigid intermediate portion and a mounting portion;

a rigid ground bar extending lengthwise along the housing and secured thereto, the ground bar being in communication with the recess along the sides of the housing; and a chip capacitor having two electrodes and being disposed in the recess with one of said electrodes in electrical contact with the contact and the other of said electrodes being in electrical contact with said ground bar;

whereby the capacitor is secured within the recess between the rigid intermediate portion of the contact and the rigid ground bar.

2. The connector of claim 1, wherein an end cap is disposed over the mounting flange, the end cap having extensions which are electrically connected to the ground bar to provide ground connection to the circuit board.

3. The connector of claim 1, wherein the housing has a slot disposed therealong, the ground bar being secured within the slot.

4. The connector of claim 3, wherein the ground bar has a securing portion which is secured within the slot, a mounting portion which is perpendicular to the securing portion, and an angled portion which extends from the securing portion to the mounting portion.

5. The connector of claim 4, wherein a silicon rubber pad is secured along the mounting face to secure the chip capacitor within the recess, the silicon rubber pad having a through hole which the contact extends through, the silicon rubber pad being secured to the mounting portion of the ground bar.

6. The connector of claim 1, wherein the mounting portion of the contact has resilient legs for engaging with a through hole in a circuit board.

7. The connector of claim 1, wherein the sidewalls of the housing have an overhang which is directed toward the mounting face, the overhang having a slot therealong to secure the ground bar therein.

8. The connector of claim 7, wherein walls extend downwardly from the overhang to define the recess along the mounting face.

9. The connector of claim 8, wherein contacts are disposed in the housing in two rows, a center wall extends along the mounting face to separate adjacent recesses from each other.

10. The connector of claim 1, wherein the housing is mounted on a circuit board and the mating face extends upwardly therefrom.

11. The connector of claim 10, wherein the mounting portion of the contact is a through hole contact, the circuit board having through holes to receive the mounting portion.

12. The connector of claim 1, wherein an elastomeric pad is disposed along the mounting face to retain the chip capacitor within the recess, whereby upon mounting of the connector to a circuit board, the elastomeric pad provides a force against the chip capacitor which is directed toward the ground bar, the ground bar then directs the force toward the contact thereby providing good electrical connection between the chip capacitor and the ground bar, and between the chip capacitor and the contact.

13. The connector of claim 12, wherein the chip capacitors are disposed within the recess at an angle with respect to the contact.

* * * * *